United States Patent [19]

Prilik et al.

[11] Patent Number: 4,841,485

[45] Date of Patent: Jun. 20, 1989

[54] READ/WRITE MEMORY DEVICE WITH AN EMBEDDED READ-ONLY PATTERN AND METHOD FOR PROVIDING SAME

[75] Inventors: Ronald J. Prilik, South Burlington; James R. Varner, Essex Junction, both of Vt.

[73] Assignee: International Business Machines Corporation, Armonk, N.Y.

[21] Appl. No.: 116,818

[22] Filed: Nov. 5, 1987

[51] Int. Cl.$^4$ .............................................. G11C 13/00
[52] U.S. Cl. ................................... 365/201; 365/154; 365/226; 365/189.03
[58] Field of Search ............... 365/154, 182, 189, 201, 365/226

[56] References Cited

U.S. PATENT DOCUMENTS

| | | |
|---|---|---|
| 3,805,152 | 4/1974 | Ebersman et al. |
| 3,961,252 | 6/1976 | Eichelberger |
| 3,961,254 | 6/1976 | Cavaliere et al. |
| 4,332,028 | 5/1982 | Joccotton et al. |
| 4,481,627 | 11/1984 | Beauchesne et al. |
| 4,585,955 | 4/1986 | Uchida ............................... 365/226 |
| 4,684,826 | 8/1987 | France et al. ........................ 365/95 |

OTHER PUBLICATIONS

IBM Technical Disclosure Bulletin, vol. 23, No. 4, 9/80, "Shared Random-Access Memory and ROS Functions by Modified Random-Access Memory Design", R. J. Prilik.

Primary Examiner—Terrell W. Fears
Attorney, Agent, or Firm—Sughrue, Mion, Zinn, Macpeak, and Seas

[57] ABSTRACT

A memory array device with an embedded self-test binary pattern. The device has an array of bistable cells formed with first and second sides that are oppositely connected to a first voltage line or a second voltage line. If the first and second voltage lines are energized at the same voltage level, each of the bistable cells will function in a normal bistable mode. If the first and second voltage lines are energized at different levels, each of the bistable cells will function in an embedded binary pattern mode.

21 Claims, 5 Drawing Sheets

READ/WRITE MEMORY DEVICE WITH AN EMBEDDED READ-ONLY PATTERN AND METHOD FOR PROVIDING SAME

BACKGROUND OF THE INVENTION

1. Field of the Invention

The present invention relates to a read/write memory device with an embedded read-only pattern and also relates to a method for providing the same. This embedded read-only pattern will be shown to be particularly useful in a memory array device with an embedded self-test pattern

2. Background Art

Numerous memory array devices are well known in the art including static and dynamic memories of the read/write type. The present invention will be described in connection with a static read/write memory; however, it should be noted that the present invention is by no means limited to use with memory array devices of this type.

Figure 1:
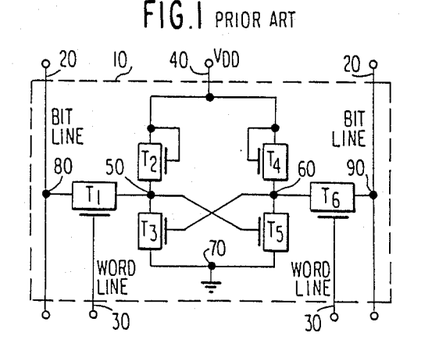
FIG. 1 is a simplified circuit diagram of a prior art six transistor static memory cell.

FIG. 1 shows a prior art 6-transistor static memory cell 10 having a symmetrical configuration of six transistors consisting of $T_1$, $T_2$ and $T_3$ on the one hand, and $T_4$, $T_5$ and $T_6$ on the other. In the description of the preferred embodiment, these transistors will be described as FET transistors, each of which has a source, gate and drain terminal. A voltage $V_{dd}$ is applied to the source and gate terminals of the transistors $T_2$ and $T_4$ whose drain terminals are connected to nodes 50 and 60, respectively. Also connected to nodes 50 and 60 are the source and gate terminals of the cross-coupled transistors $T_3$ and $T_5$ whose drain terminals are connected to ground through node 70. Also connected to nodes 50 and 60 are the drain terminals of transistors $T_1$ and $T_6$, respectively, whose gate terminals are connected to the word lines 30 of the memory cell 10. Finally, the source terminals of transistors $T_1$ and $T_6$ are connected to the bit lines 20 of the memory cell 10.

During memory operation, the cross-coupled configuration of $T_3$ and $T_5$ functions as a bistable latch, the state of which can be set or read using the bit lines 20 and word lines 30. To perform a write operation, a voltage imbalance is impressed across the nodes 50 and 60 so that the cross-coupled transistors $T_3$ and $T_5$ will be set to one of two bistable states, whereby a voltage representing a logical 1 or 0 will be maintained at the node 50, while a voltage representing an opposite logical value will be maintained at the node 60.

Figure 2:
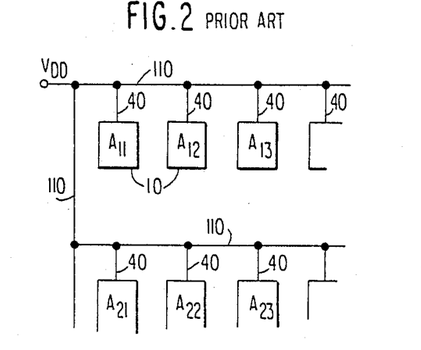
FIG. 2 is a simplified circuit diagram of a memory array constructed using a plurality of the memory cells corresponding to the memory cell shown in FIG. 1.

FIG. 2 is a simplified diagram of a memory array constructed of cells 10 of the type shown in FIG. 1. Only an exemplary section of a memory array is shown, i.e., a practical memory array would typically have a tremendous number of memory sells arranged along many more rows and many more columns. An example of a row in the illustrated memory array section is a first row consisting of memory cells $A_{11}$, $A_{12}$, $A_{13}$, ... Likewise, an example of a column in the memory array section is a first column consisting of the memory cells $A_{11}$, $A_{12}$, ... Bit lines and word lines, which are not of importance in the description of the present invention, have been omitted. As can be seen in FIG. 2, the terminals 40 of the memory cells have been connected to lines 110 which, in turn, are connectable to a single voltage supply indicated by $V_{dd}$.

Although the memory array devices described with reference to FIGS. 1 and 2 are of tremendous use in the world today, there remains the problem of testing to determine whether a memory array is properly functioning. In this regard, numerous testing approaches have been proposed. For example:

In U.S. Pat. No. 4,481,627, issued to Beauchesne et al, the testing of memory arrays within electronic assemblies is performed by using circuitry which can display a high impedance while the memory array is accessed and directly tested.

In U.S. Pat. No. 3,961,254, issued to Cavaliere et al, the input and output circuitry of a RAM is bypassed so that the embedded memory array can be accessed and directly tested.

U.S. Pat. Nos. 4,332,028, issued to Joccotton et al, and 3,805,152, issued to Ebersman et al, both disclose methods for measuring the AC parameters of a memory array by using an external recirculation technique.

Finally, U.S. Pat. No. 3,961,252, issued to Eichelberger, allows testing by converting circuitry, which is associated with an embedded memory array, to counters the outputs of which can be compared with the outputs from the memory array.

In the above-mentioned testing approaches and with prior art testing approaches in general, a binary test pattern must be loaded into the memory from the external world and, then unloaded from the memory to test for the proper operation of the memory. This procedure is disadvantageous because a binary test pattern must be stored and generated by an external device, and because the loading of the binary test pattern into the memory device increases the total testing time. Consequently, there exists a need for an improved approach whereby the need for external generation, and then loading, of the binary test pattern are eliminated. More specifically, there exists a need for a memory device which can store an embedded binary pattern which can be used as a self-test binary pattern.

SUMMARY OF THE INVENTION

The present invention provides a unique memory array device and a method which satisfy the aforementioned needs.

More specifically, the present invention utilizes an approach of dividing a symmetrical memory cell and providing each side of the divided memory cell with a separate voltage line. If the voltage lines are energized at the same voltage level, the divided memory cell will function as a normal memory cell. If the voltage lines are energized at different voltage levels, the divided memory cell will operate to exhibit an embedded binary bit. If such divided memory cells are configured in a memory array formation having a first voltage line and a second voltage line, there is formed a memory array device which has an embedded read-only binary pattern.

Accordingly, the present invention relates to a memory array device with an embedded binary pattern, the memory array device having an array of bistable cells, each of which is associated with a respective address value, the memory array device comprising: a first voltage line and a second voltage line; each of the bistable cells being constructed with first and second sides that are selectively connected to the first voltage line or the second voltage line such that: (a) during times when the first and second voltage lines are energized at the same voltage level, each of the bistable cells will function in a bistable mode; and (b) during times when the first and second voltage lines are energized at different voltage levels, the bistable cells will function in an embedded binary pattern mode, each of the bistable cells being set to a logical value which corresponds to the selected connection of each bistable cell to the first and second voltage lines.

The present invention also relates to a memory array device with an embedded binary pattern, the memory array device having an array of bistable cells, wherein different groups of the bistable cells are associated with respective address values, the memory array device comprising: a first voltage line and a second voltage line; each of the bistable cells being constructed with first and second sides that are selectively connected to the first voltage line or the second voltage lines such that: (a) during times when said first and second voltage lines are energized at the same voltage level, each of the bistable cells will function in a bistable mode; and (b) during times when said first and second voltage lines are energized at different voltage levels, the bistable cells will function in an embedded binary pattern mode, each of the bistable cells being set to a logical value which corresponds to the selected connection of each bistable cell to the first and second voltage lines.

The present invention additionally relates to a memory array device with an embedded self-test pattern, the memory array device having an array of bistable cells, each of which is associated with a respective address value, the memory array device comprising: a first voltage line and a second voltage line; each of the bistable cells being constructed with first and second sides that are selectively connected to the first voltage line or the second voltage line such that: (a) during times when the first and second voltage lines are energized at the same voltage level, each of the bistable cells will function in a bistable mode; and (b) during times when the first and second voltage lines are energized at different voltage levels, the bistable cells will function in an embedded self-test pattern mode, each of the bistable cells being set to a logical value which corresponds to the selected connection of each bistable cell to the first and second voltage lines.

The present invention further relates to a method of providing a memory array device with an embedded binary pattern, the memory array device having an array of bistable cells, the method comprising the steps of: providing a first voltage line and a second voltage line; providing each of the bistable cells with a first side and a second side which are selectively connected to the first and second voltage lines; energizing the first and second voltage lines at the same voltage level to operate the bistable cells in a bistable mode; and energizing the first and second voltage lines at different voltage levels to operate the bistable cells in an embedded binary pattern mode, each of the bistable cells being set to a logical value which corresponds to the selected connection of each bistable cell to the first and second voltage lines.

It is, therefore, an important object of this invention to provide a memory array device and method which realize a memory array having an embedded binary pattern.

Another object of the invention is to provide a memory device and method which realize a memory array having a embedded self-test binary pattern.

A further object is to allow testing of a memory array device without the necessity of having an external device for storing or generating a binary test pattern.

Another object is to allow testing of a memory array device without the necessity of loading an external binary test pattern into the memory array.

These and other objects and advantages of the present invention will become more fully apparent from the following description made in connection with the accompanying drawings, wherein:

DETAILED DESCRIPTION OF THE PREFERRED EMBODIMENTS

Figure 3:
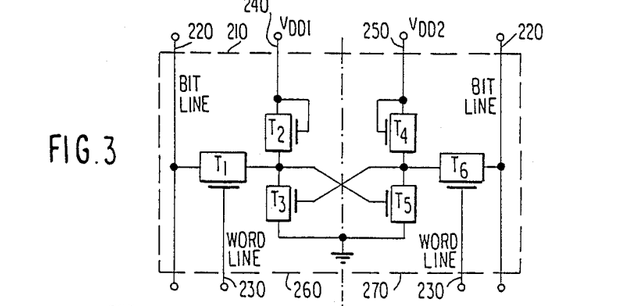
FIG. 3 is a simplified circuit diagram of a memory cell of the invention.

A preferred embodiment of a memory cell 210 of the present invention is shown in FIG. 3. The memory cell 210 is divided into a memory cell first side 260 and a memory cell second side 270. This division is accomplished via a first voltage terminal 240 and a second voltage terminal 250 which are connected to the drain and gate terminals of each of $T_2$ and $T_4$, respectively. The remainder of the memory cell circuit of FIG. 3 is the same as that described with reference to the prior art memory cell 10 in FIG. 1.

With the above-described construction, the memory cell 210 can operate in two different modes. First, during times when the same voltage level is applied to the first and second voltage terminals 240 and 250, the memory cell 210 will function in a normal memory cell mode; i.e., the memory cell 210 will operate in the same bistable manner as the prior art memory cell of FIG. 1, with the memory cell 210 being able to be set to a logical 1 or logical 0.

However, during times when different voltage levels are applied to the first and second voltage terminals 240 and 250, the memory cell 210 will operate in the second embedded binary bit mode. The difference in voltage causes an imbalance between the cross-coupled transistors $T_3$ and $T_5$. Therefore, the circuit formed by cross-coupled transistors $T_3$ and $T_5$ is forcibly set to display a logical "1" or a logical "2", depending on which voltage $V_{dd1}$ or the $V_{dd2}$ is energized first. This aspect of the invention is best described in conjunction with FIGS. 4 through 6.

Figure 4:
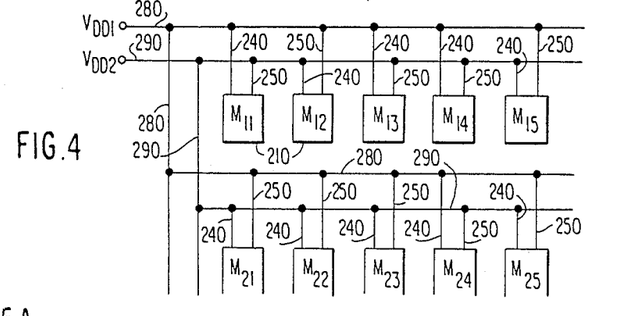
FIG. 4 is a simplified circuit diagram of a memory array constructed using a plurality of memory cells of the present invention.

FIG. 4 is a simplified circuit diagram of a memory array constructed with the memory cells shown and described with reference to FIG. 3. For sake of simplicity and clarity, word lines, bit lines and addressing circuitry are not shown; i.e., the methods and circuitry for accessing a memory array are well known in the art.

The memory array shown in FIG. 4 consists of rows and columns, for example, row 1 consists of the memory cells $M_{11}$, $M_{12}$, $M_{13}$, $M_{14}$, $M_{15}$, ... and column 1 consists, of memory cells $M_{11}$, $M_{21}$, ... The memory array is also provided with a first voltage line 280 and a second voltage line 290. The first voltage terminal 240 of each memory cell is selectively connected to either the first voltage line 280 or the second voltage line 290. The second voltage terminal 250 of each memory cell is then connected to the voltage line 280 or 290 which is not connected to the first voltage terminal 240. Thus, each memory cell in the memory array has two voltage terminals which are oppositely connected to a first voltage line 280 and a second voltage line 290. As an example, memory cell $M_{11}$ has a first voltage terminal 240 connected to the first voltage line 280, and a second voltage terminal 250 connected to a second voltage line 290. The memory cell $M_{12}$ is oppositely connected, with a first voltage terminal 240 connected to the second voltage line 290 and the second voltage terminal 250 connected to the first voltage line 280. The remaining memory cells in the array are also connected in one of the two manners hereinbefore described.

With the memory array being constructed of memory cells 210 of the present invention and connected as indicated, the memory array of FIG. 4 can also operate in two different modes. First, if the first and second voltage lines 280 and 290 are energized at the same voltage level, the memory array will function in a normal bistable memory array mode; i.e., it will operate in the same manner as the prior art memory array shown in FIG. 2.

Figure 5A:
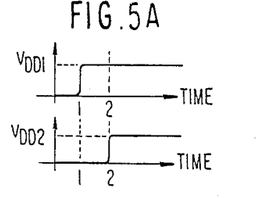
FIG. 5A consists of voltage graphs showing a voltage $V_{dd1}$ being energized before voltage $V_{dd2}$.
Figure 5B:
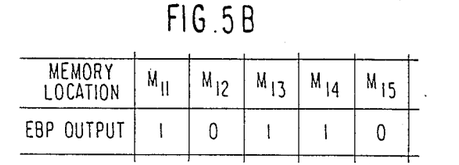
FIG. 5B is a chart showing the Embedded Binary Pattern (EBP) output for row 1 of the memory array shown in FIG. 4, when $V_{dd1}$ is energized before $V_{dd2}$.
Figures 6A, 6B, 7A:
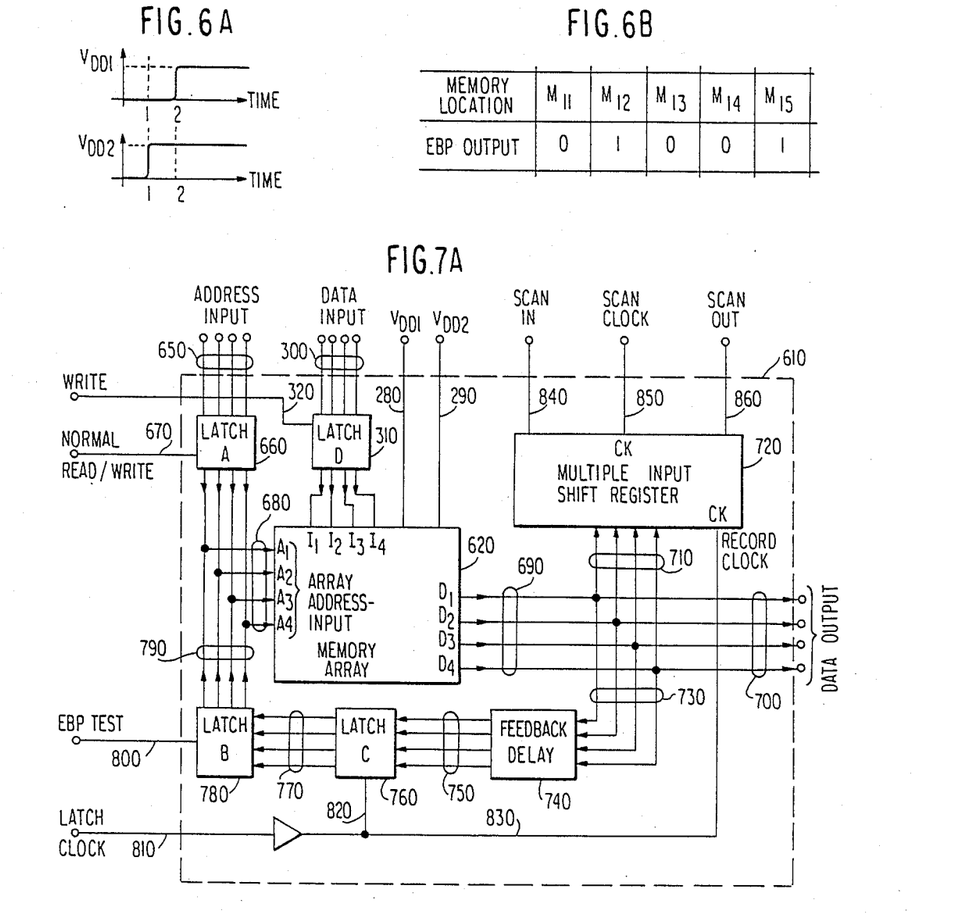
FIG. 6A consists of voltage graphs showing a voltage $V_{dd2}$ being energized before a voltage $V_{dd1}$.
FIG. 6B is a chart showing the complement Embedded Binary Pattern (EBP) output for row 1 of the memory array, shown in FIG. 4, when $V_{dd2}$ is energized before $V_{dd1}$.
FIG. 7A is a simplified circuit diagram of a memory array device of the present invention and having an embedded binary pattern and feed-back capabilities.

The second mode of operation for the memory array shown in FIG. 4 is the embedded binary pattern mode which is best described in conjunction with FIGS. 4, 5 and 6.

In FIG. 4, a first voltage $V_{dd1}$ is shown applied to a first voltage line 280, and a second voltage $V_{dd2}$ is shown applied to a second voltage line 290. During times when the voltage $V_{dd1}$ applied to the first voltage line 280 is at a different level from the second voltage $V_{dd2}$ applied to the second voltage line 290, the memory array will operate in the embedded binary pattern mode. An example of different voltage levels is shown in the voltage graphs of FIG. 5A, wherein a voltage $V_{dd1}$ is shown being at a higher level than $V_{dd2}$ between times $T=1$ and $T=2$.

FIG. 5B is an example of a portion of the embedded binary pattern displayed by the memory array in FIG. 4, when the voltage waveforms shown in FIG. 5A are applied to the first and second voltage lines 280 and 290. More specifically, FIG. 5B shows the Embedded Binary Pattern (EBP) output for the first row of the memory array shown in FIG. 4. Thus, it can be seen that, if a voltage $V_{dd1}$ applied to the first voltage line 280 is at a different level from $V_{dd2}$ applied to the second voltage line 290, memory cells $M_{11}$, $M_{13}$ and $M_{14}$ will display a logical "1". This directly corresponds to the first voltage terminal 240 of each of the memory cells $M_{11}$, $M_{13}$ and $M_{14}$ in the memory array of FIG. 4 being connected to the first voltage line 280. In contrast, memory cells $M_{12}$ and $M_{15}$ in the array have their first voltage terminals 240 connected to the second voltage line 290, thereby resulting in the memory cells $M_{14}$ and $M_{15}$ displaying a logical "0" as indicated in the chart of FIG. 5B. Thus, the portion of the memory array consisting of memory cells $M_{11}$, $M_{12}$, $M_{13}$, $M_{14}$ and $M_{15}$ have EPB outputs corresponding to the embedded binary pattern 10110. It should now be evident that each of the first and second voltage terminals 240 and 250 in the memory array of FIG. 4 can be selectively connected to either the first voltage line 280 or the second voltage line 290 such that any desired embedded binary pattern can be embedded in the array. This embedded binary pattern is a permanent pattern associated with the memory array, as it has in effect been hardwired into the construction of the memory array.

At this point, let us discuss making transitions between the first and second operating modes. First, to make a transition from a read/write mode to an embedded pattern mode, it was previously stated that an imbalance between the two voltage lines 280 and 290 must be created. As a result of this imbalance, the memory cells are, in effect, reset to the hardwired embedded binary pattern which is then available to be read-out using the appropriate wordlines and bitlines. An important aspect to note is that, as a result of this reset operation, any read/write data which were previously stored in the memory array are lost.

Once in the embedded binary pattern mode, the imbalance between the two voltage lines can be maintained to effectively lock the memory array into the embedded binary pattern, or the voltage lines can subsequently be energized to the same voltage level to make a transition back to the read/write mode. If a transition is made back to the read/write mode, the memory cells will still display the embedded binary pattern. However, the pattern can now be over-written as the memory cells are now operating in a read/write mode due to the equal voltages applied to both memory cell sides.

In another aspect of the present invention, the memory array can also be energized to display a complementary embedded binary pattern. In the above description, an embedded binary pattern was shown to be created when a voltage $V_{dd1}$ was at a higher voltage level than the voltage $V_{dd2}$. If the voltage $V_{dd2}$ is applied at a higher voltage level than the voltage $V_{dd1}$ as shown in FIG. 6A, a complementary embedded binary pattern is displayed as indicated in FIG. 6B. Thus, the memory array portion, consisting of memory cells $M_{11}$, $M_{12}$, $M_{13}$, $M_{14}$, and $M_{15}$, is shown to have EBP outputs which correspond to the embedded binary pattern 01001, which is the complement of the embedded binary pattern shown in FIG. 5B.

In summation of the above, it can be seen that there can be constructed a read/write memory array which has the additional feature of being able to display an embedded binary pattern when the two voltage terminals are energized at different voltages. This additional feature finds uses in numerous applications. As a first example, the memory cell sides can be selectively connected such that the embedded binary pattern is tailored to correspond to a set of machine instructions. One application using these instructions is to have the memory device provide read-only initializing instructions during start-up, and then function as a read/write storage memory during operation. In a second application, the memory device functions as a read/write storage memory during normal operation, and functions to provide an emergency set of instructions during an emergency operation.

In addition to providing a set of machine instructions, another important use of the present invention concerns testing for the correct operation of the memory device. As mentioned previously, prior art testing approaches were inefficient in that an external device was required to store and load a binary test pattern. Using the present invention, this inefficiency can be avoided by embedding a self-test pattern into the memory array. By energizing the voltage terminals at different voltages, external devices can be used to read out the self-test pattern to test for the correct operation of the memory array. This approach is attractive in that total testing time is decreased because the test pattern need not be generated and loaded into the memory array.

In an approach more sophisticated than using discrete external testing devices, a memory device can be constructed which incorporates many of the operations normally performed by external devices. In the following description, a memory array device which uses this approach will be described; however, it should be remembered that each of the testing structures described could instead be discrete constructions which are provided externally from the memory array IC.

In FIG. 7A, there is shown a preferred embodiment of a memory array device 610 which utilizes a memory array of the present invention as described with reference to FIG. 4. The memory array device 610 has a memory array 620 having four array address inputs $A_1$-$A_4$, four array data input lines $I_1$-$I_4$ and four array data output lines $D_1$-$D_4$.

In a normal mode of operation, addressing is accomplished by applying an address to the device address input lines 650. The addresses are then applied to the inputs of latch A 660, which is controlled by a normal read/write line 670. When latch A 660 is selected via the normal read/write line 670, he address at the input of latch A is latched and is applied to the array address input line 680. If a write operation were desired in the normal mode of operation, write data would be applied to the device data input lines 300. The write data on device data input lines 300 are then applied to the inputs of latch D 310. Latch D 310 is turned by a signal applied via the write terminal and line 320. When latch D 310 is turned on, the write data at its inputs are allowed to pass to the four array data input lines $I_1$-$I_4$ and, thus, be written into the array 620.

If a normal read operation is desired, addressing again occurs as was described above; however, latch D 310 is turned off such that the memory array 620 will supply array data outputs along lines 690 to the device data output terminals 700. In the above-described normal mode of operation, the first voltage line 280 and the second voltage line 290 have been energized by the same voltage level; therefore, in the normal read mode of operation, it is not the embedded binary pattern which is being output by the memory array 620, but, instead, the data which had been previously input and stored at that particularly memory location.

Incidentally, any other well known latch constructions can be used for latches A-D. However, during experimentations it was found that FET amplifiers used as gate switches were a preferred embodiment providing minimum delay.

A second mode of operation of the memory array device 610 is the self-test binary pattern mode. In this mode, latch A-660 is turned off via the normal read/write line 670 such that it does not latch address values at its inputs to the memory array 620. To operate the memory array device 610 in a self-test binary pattern mode, the voltage lines 280 and 290 of the memory array 620 are energized at different voltages, i.e., the same mode of operation that was previously described with reference to FIGS. 4–6.

In the self-test binary pattern mode of operation, an address is input to the memory array 620 via the array address inputs $A_1$-$A_4$. In response, an embedded binary data is output at array data outputs $D_1$-$D_4$. These embedded binary pattern outputs are output on array data output lines 690, and appear at the device output data lines 700. The embedded binary pattern outputs on array data output lines 690 also propagate through feedback lines 730 to a feedback delay 740. The outputs from the feedback delay 740 appear on the feedback lines 750, to be applied to the inputs of a latch C 760. The outputs from the latch C 760 appear on the feedback lines 770, and are applied to a latch B 780. During the embedded binary pattern mode, the latch B is selected on via an EBP test terminal and a line 800. With latch B 780 selected on, data at its input flows through to appear as output on feedback lines 790. Feedback lines 790 in turn apply the data to the array address input lines $A_1$-$A_4$. Thus, there is constructed a feedback loop for the embedded binary pattern outputs of the memory array 620 which consist of array data output lines 690, feedback lines 730, feedback delay 740, feedback lines 750, latch C 760, feedback lines 770, latch B 780, feedback lines 790, and array address input lines 680.

The flow of the embedded binary pattern data around this feedback loop is controlled by the latching of the latch C 760. This control is accomplished via the latch clock terminal, line 810 and line 820, whereby a latch clock pulse is applied to the latch C 760 to control the flow of the feedback at the speed desired. The feedback delay 740 is also of importance in the feedback operation in that it creates a delay in the flow of the embedded binary pattern data through the feedback loop to prevent the occurrence of a race condition. The feedback delay 740 is designed to provide a delay time which is greater than the access time $T_{acc}$ of the memory array 620. The access time $T_{acc}$ is defined as the amount of time that it takes data to appear at the outputs of the memory array after an address is applied to the array address inputs.

The memory array device 610 is also equipped with a multiple input shift register (MISR) 720 which receives at its inputs the embedded binary pattern data via array data output lines 690 and MISR input lines 710. In the embodiment shown in FIG. 7A, the clock pulses applied to the latch clock terminal are also applied to the MISR record clock terminal via lines 810 and 830. Thus, every clock pulse applied to the latch clock terminal is also applied to the MISR record clock terminal. Every time the feedback loop is latched by the clock pulse to latch C 760, the MISR records the embedded binary pattern output which is available at its inputs. The capacity of the MISR 720 should be sufficient to store the entire binary test pattern which is expected to be encountered. Once a entire cycle of embedded binary pattern outputs has been recorded in the MISR 720, the stored pattern outputs are read out of the MISR 720 via a scan-out terminal 860. The scanning out of the MISR 720 is controlled by a scan clock pulse applied to the scan clock terminal 850. Thus, the cycle of embedded binary pattern outputs which is stored in the MISR 720 can be read out at a faster or slower rate than that of the feedback loop.

Another useful feature shown with regard to the multiple input shift register 720 is the scan-in terminal 840. This feature is important in that the Multiple Input Shift Register 720 can be tested by reading in a known test pattern via the scan line terminal 840. Scanning into the MISR 720 via the scan-in terminal is also controlled by the scan clock pulse applied to the scan clock terminal 850. Once the known test pattern has been scanned into the MISR 720, the test pattern can be scanned out via the scan-out terminal to test for the correct operation of the MISR 720.

Thus, there has been described a memory array device 610 which has a self-test capability which will be more fully described with reference to FIG. 7B which is a flow diagram showing both the array address inputs and also the resulting embedded self-test pattern data outputs. The feedback of these data outputs to the array address inputs is indicated by the respective flow diagram arrows.

Figure 7B:
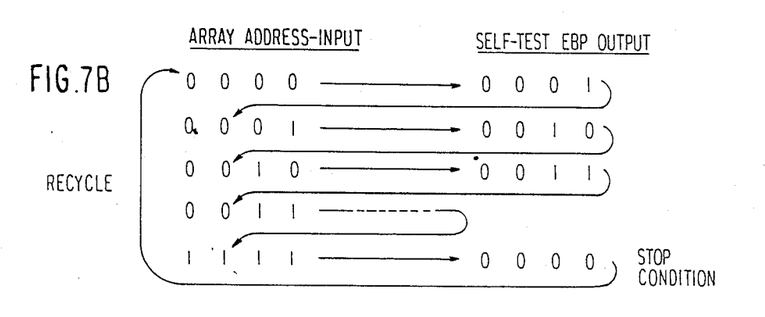
FIG. 7B is a flow diagram showing an example of an embedded binary test pattern which can be used to step through a binary count sequence.

With reference to FIG. 7b, an address 0000 is shown applied to the array address inputs at the beginning of the self-test binary pattern mode. This address 0000 can be guaranteed at the array address inputs via the turning off of latch A 660 and latch B 780. In FIG. 7B, an array address input of 0000 is shown to result in an embedded self-test pattern data output of 0001. This embedded self-test data pattern output 0001 would thus be emerging from the array data outputs $D_1$–$D_4$ and appear on the array data output lines 690 in FIG. 7A, and then would propagate around the feedback loop via the array data output lines 690, feedback lines 730, feedback delay 740, feedback lines 750, latch C-760, feedback lines 770, latch B 780, feedback lines 790 and array address input lines 680. Note again that the feedback delay 740 would provide adequate delay to prevent a race condition from occurring. The embedded self-test pattern data output 0001 also propagates along array data output lines 690 and MISR input lines 710 and is applied to the inputs of the MISR 720. Upon the arrival of the next clock pulse of the MISR record clock terminal, the embedded self-test pattern data output 0001 will be recorded in the MISR 720.

With reference again to FIG. 7B, the new feedback array address input of 0001 is shown to produce an embedded self-test pattern data output 0010 which appears at the array data outputs $D_1$–$D_4$, and which will propagate around the feedback loop and be recorded by the MISR 720 in the manner described immediately above.

From FIG. 7B, it can be seen that the memory array 620 operating in a self-test embedded binary pattern mode is programmed to display a binary count sequence in the preferred embodiment. This output of a binary count sequence is fed back to the array address inputs to sequence through the addressing in a binary sequence count fashion. As shown in FIG. 7B, the final embedded self-test pattern data output 0000 can be either used to indicate a stop condition, or be fed back to the array address inputs to cause the memory array device 610 to go through another self-test cycle.

In order to perform a complete testing operation, the memory array 620 should also be tested with the complementary embedded self-test pattern in a manner similar to that which was described with reference to FIGS. 7A and 7B for the normal embedded self-test pattern. However, it should be noted that, during this half of the testing operation, inverters must be provided somewhere along the feedback path to invert the complementary pattern for the self-testing sequencing to work properly. This is also true with respect to the preferred embodiment of FIG. 11 to be described ahead. One suitable method for providing this inversion would be to use programmable XOR's in the feedback delay block 740.

With reference to FIGS. 8A through 8F, there are shown timing signals at various locations throughout the memory array device 610 of FIG. 7A. It must be remembered that these timing signals are for a memory array device 610 operating in an embedded binary pattern mode.

Figure 8A:
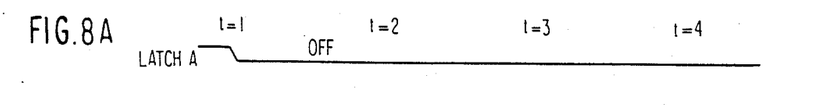
FIGS. 8A through 8F are timing diagrams showing timing signals at various locations within the circuit of the preferred embodiment of FIG. 7A.
Figure 8B:
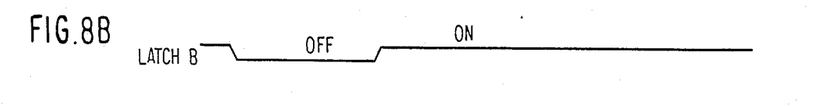
Figure 8C:
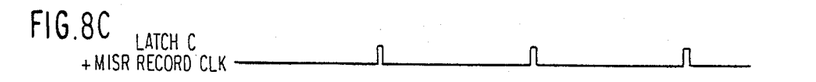
Figure 8D:
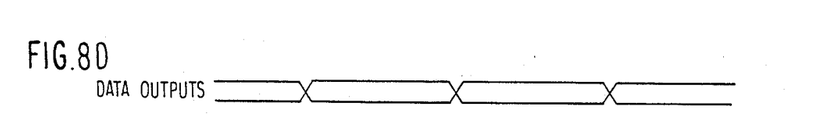
Figure 8E:
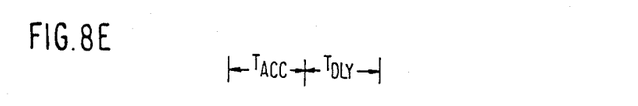
Figure 8F:
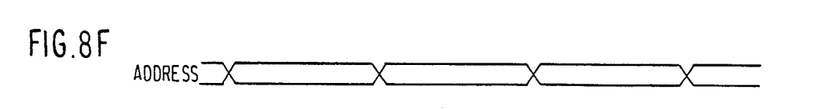

In FIGS. 8A and 8B, latch A and latch B respectively are shown being turned off. Note that, in the beginning of the binary test pattern count sequence, this guarantees an array address input of 0000 as was described in the description with reference to FIG. 7B. Latch A remains off throughout the entire testing cycle to keep the memory array device 610 from operating in a normal read/write fashion. In contrast, latch B is turned on at T=2 to allow the memory array device 610 to operate in the embedded binary self-test pattern mode. Thus, with latch B turned on, the feedback loop is activated, and the feedback through the feedback loop can be controlled by the clock pulses applied to the latch C. FIG. 8C shows the clock pulses which are applied to the latch C and the MISR record clock terminal. Clock pulses are shown occurring at times T=2, T=3, T=4 . . . Every time a clock pulse is applied to the latch C, the feedback flow is pulsed to cause the memory array 620 to advance another step through the binary self-test count sequence. FIG. 8D shows the data outputs which occur at the array data outputs $D_1$ through $D_4$. In FIG. 8E, there is shown at time $T_{acc}$ which represents the access time required for data to appear at the array device outputs once an address is applied to the array address inputs. Also shown in FIG. 8E is a time $T_{dly}$ which represents the delay time which is chosen for the feedback delay 740 in FIG. 2A. Note that the delay time $T_{dly}$ chosen is slightly longer than the access time $T_{acc}$ of the memory array. Again, as described before, this is to prevent any race condition from occurring while the memory array device 610 utilizes a feedback loop operation. FIG. 8F shows the addresses being applied to the array address inputs of the memory array 620.

In the above self-test descriptions, a memory array device was described wherein the number of bits of array address input matched the number of bits of array data outputs. The present invention can also be used where the number of bits of array address inputs is different from the number of bits of array data outputs. Examples of these are shown in FIGS. 9 and 10.

Figure 9:
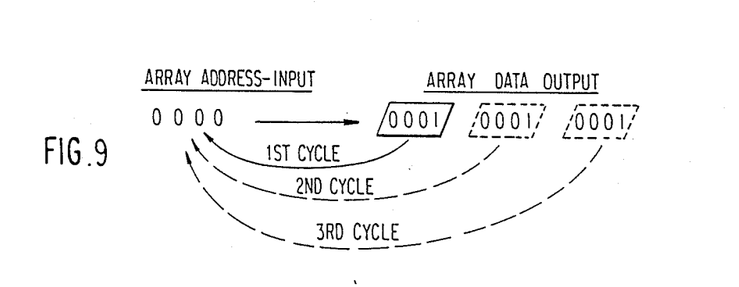
FIG. 9 is a flow diagram showing the various cycles of feedback when the number of bits of data output exceeds the number of bits of address input.

In FIG. 9, there are four bits of array address input, and 12 bits of array data outputs. To utilize the present invention in a feedback manner, the 12 bits of array data outputs are divided into groups of four bits. During the first cycle of testing the first four bits of the array data output are feed back to the array address inputs. During the second cycle of testing, the second group of four bits is feed back to the array address inputs. Finally, during the third cycle of testing the last group of four bits of the array data outputs is feed back to the array address inputs. Thus, testing is accomplished for all 12 bits of array data outputs.

Figure 10:
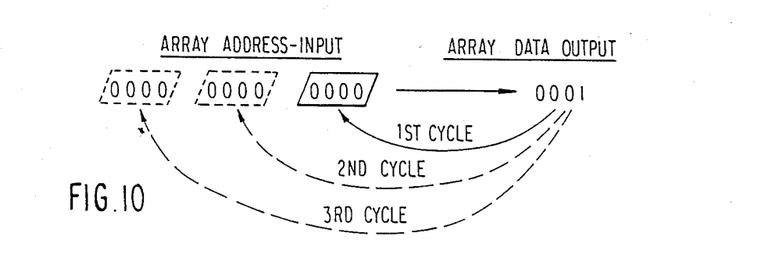
FIG. 10 is a flow diagram showing the various cycles of feedback when the number of bits of address input exceeds the number of bits of data output.

FIG. 10 shows a diagram when the opposite is true; i.e., the number of bits in the array address inputs exceeds the number of bits in the array data outputs. More specifically, the array address inputs consist of twelve bits, whereas the array data outputs consists of four bits. This situation can be handled in a manner similar to that which was described with reference to FIG. 9; however, the feedback operation would be more complicated in order to use four output bits to increment through twelve bits of addressing. This complex operation will not be described because, as a general rule, a memory array device which has more data output bits than address input bits is much more common.

Figure 11:
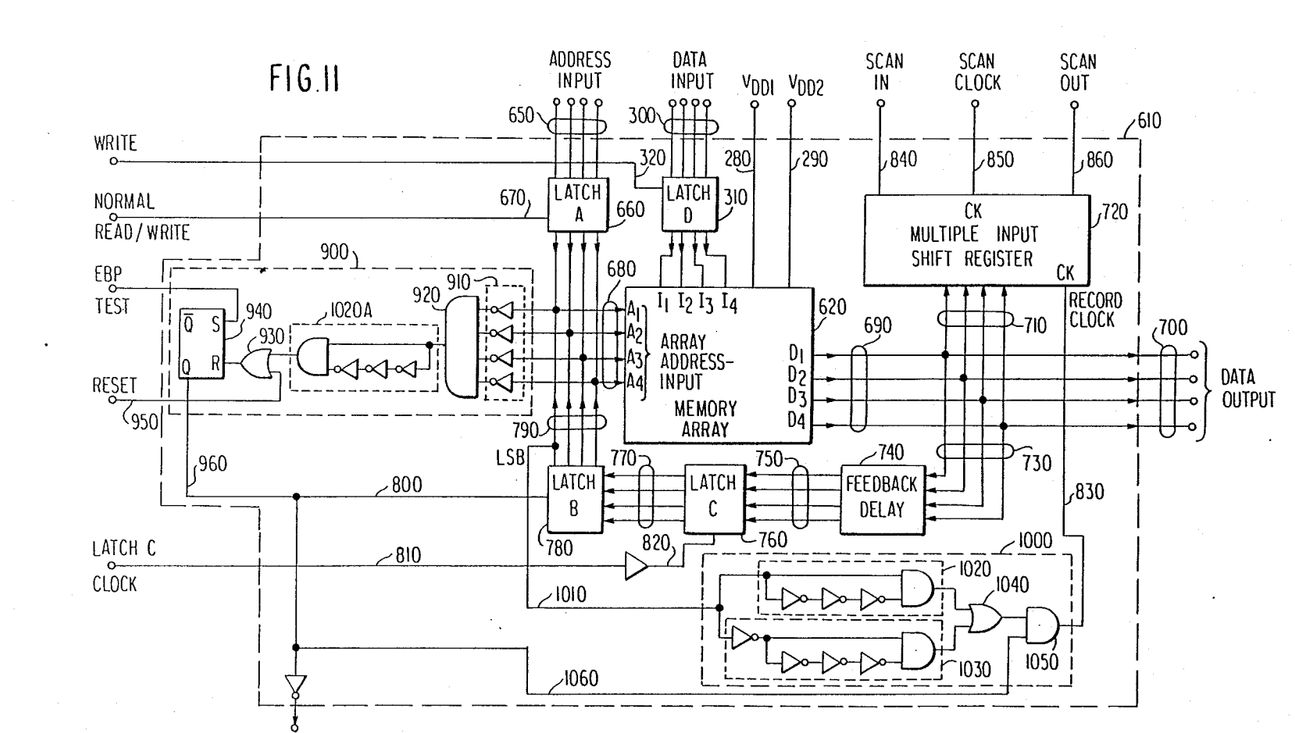
FIG. 11 is an alternative preferred embodiment having additional circuitry which facilitates self-testing with the embedded binary pattern.
Figure 12:
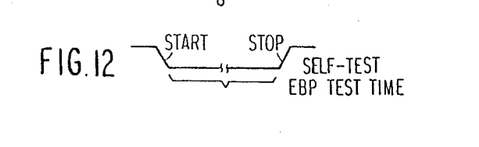
FIG. 12 is a timing diagram of the self-test time waveform generated by the circuitry of FIG. 11.

Turning now to FIG. 11, a memory array device 610 is shown with an alternative embodiment which contains further arrangements to limit the execution of self-testing with the embedded binary pattern for one cycle. The majority of the circuitry for the memory array device 610 shown in FIG. 11 is the same as that which was shown and described with reference to FIG. 7A. Added to the memory array device 610 is a stop circuit 900 and a MISR record clock circuit 1000.

In describing the construction of the stop circuit 900, the EBP test terminal, which was shown feeding a line 800 and latch B in FIG. 7A, is instead routed to feed the SET input of an RS flip-flop 940. The Q output from the RS flip-flop 940 is fed to latch B via lines 960 and 800, and also to the MISR record clock circuit 1000 via lines 960 and 1060. Finally, the Q output from the RS flip-flop 940 is also output from the memory array device 610 to the start-stop waveform terminal via line 960.

In the construction of the start-stop circuit 900 the array address inputs appearing along lines 680 are inverted via the inverted group 910 and are applied to the inputs of an AND gate 920. The output of the AND gate 920 is applied to the first input of an OR gate 930. The second input of the OR gate 930 is fed from a reset terminal via line 950. The output from the OR gate 930 is applied to the RESET input of the RS flip-flop 940.

Turning now to a description of the construction of the MISR record clock circuit 1000, the least significant bit (LSB) of the array address inputs is fed via line 1010 to the MISR record clock circuit 1000 and is first applied to a first inverter/AND group 1020 whose output is applied to a first input of the OR gate 1040. The LSB along line 1010 is also applied to a second inverter/AND group 1030 whose output is applied to a second input of an OR gate 1040 whose output, in turn, is applied to a first input of an AND gate 1050. The second input of the AND gate 1050 is supplied by the Q output of the RS flip-flop 940 along lines 960 and 1060. The output from the AND gate 1050 is applied to the MISR record clock input via line 830.

The operation of the memory array device 610 of FIG. 11 will be described with reference to the waveform and timing diagrams of FIGS. 12, 13A, 13B, and FIGS. 14A through 14G. The read/write operation and the feedback loop operation of the memory array device 610 have been previously described with reference to FIGS. 7A, 7B, and FIGS. 8A through 8F.

Figure 14A:
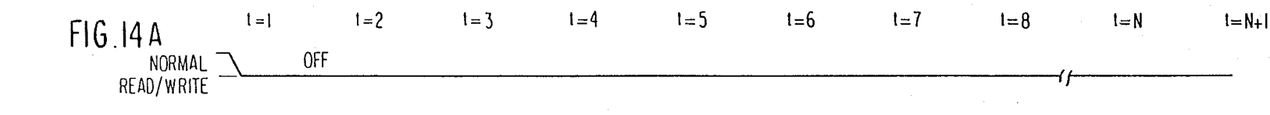
FIG. 14A through 14G are timing diagrams showing timing signals at various locations within the preferred embodiment shown in FIG. 11.
Figure 14B:
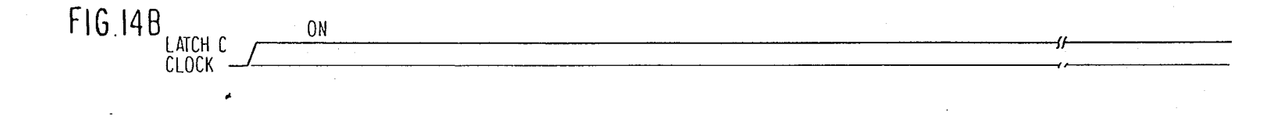
Figure 14C:
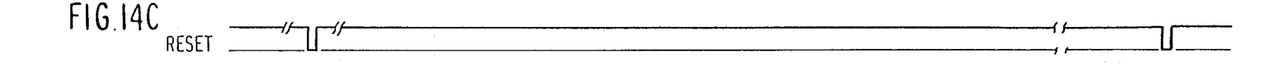
Figure 14D:
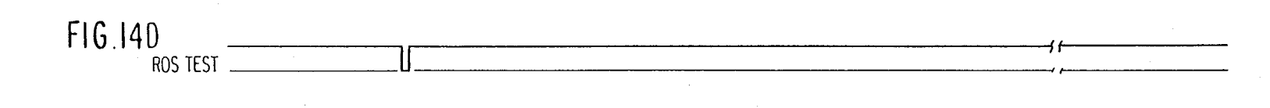
Figure 14E:
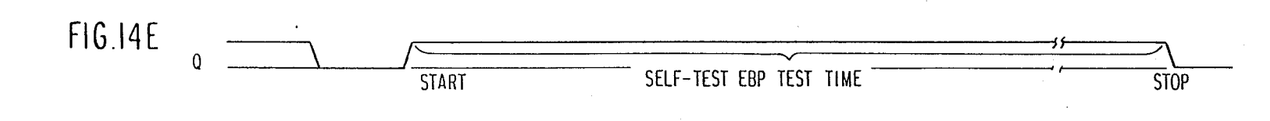

To begin operation of the memory array device 610 in a self-test cycle, the input along the normal read/write terminal is forced low to turn off the latch A as indicated in FIG. 14A. Latch D would be turned off in a likewise manner. Also, as shown in FIG. 14B, the input at the latch clock terminal is such that the latch C is selected ON. Note that in this embodiment, as opposed to the embodiment in FIG. 7A, the input at the latch clock terminal is not fed to the MISR record clock input. Instead, as described above, the MISR record clock input is fed by the MISR record clock circuit. Also shown in FIG. 14C between time $T=1$ and $T=2$, a reset pulse is applied to the RS flip-flop 940 via the alternate reset terminal 950, to guarantee that the Q output of the RS flip-flop 940 is a logical "0", thereby insuring that the latch B in the feedback loop is selected OFF, and that the MISR record clock circuit 1000 will not generate a record clock pulse. The Q output timing waveform is shown in FIG. 14E.

To initiate the self-test cycle, a pulse is applied to the EBP test terminal to set the RS flip-flop 940. As seen in FIGS. 14D and 14E, once the pulse is applied to the EBP test terminal, the Q output of the RS flip-flop is forced high. The high output from Q is applied via lines 960 and 800 to select ON the latch B. With the latch C being selected ON, and also the latch B being selected ON, the feedback loop is effectively completed. Thus, array data output will begin to be feed back to the array address inputs via the feedback loop. It should be noted that, with latch B and latch C being selected constantly ON, the rate of flow of feedback through the feedback loop is controlled only by the feedback delay 740.

Figure 13A:
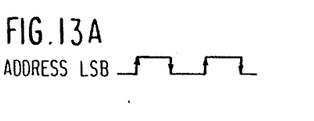
FIG. 13A is a timing diagram showing the waveform of the least significant bit of the array address input to the in FIG. 11.
Figure 13B:
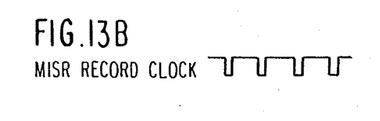
FIG. 13B is a timing diagram showing multiple input shift register (MISR) record clock pulses generated in response to the waveform indicated in FIG. 13A.

As the testing cycle sequences through the self-test embedded binary count sequence, the LSB of the array address inputs will toggle high and low as shown in FIG. 3A. The waveform of the LSB shown in FIG. 3A is applied to the MISR record clock circuit 1000. Note that the AND gate 1050 in the MISR record clock circuit 1000 is selected ON by the high Q output via lines 960 and 1060. The first inverter/AND group 1020 is constructed such that it will respond to the positive-going transitions of the LSB to produce a clock pulse output. The second inverter/AND group 1030 is constructed such that it responds to the negative-going transitions of the LSB to produce a clock pulse output. The output from the first inverter/AND group 1020 and the output from the second inverter/AND group 1030 are fed to the inputs of an OR gate 1040. The OR gate 1040 allows the clock pulse outputs from both the first inverter/AND group 1020 and the second inverter/AND group 1030 to pass, thereby producing the MISR record clock pulse shown in FIG. 3B. Since the AND gate 1050 has been selected ON by the high Q output, this MISR record clock pulse propagates through the AND gate 1050 and is applied to the MISR record clock input via line 830. Thus, the MISR record clock circuit 1000 produces a clock pulse for every positive-going or negative-going transition of the LSB of the array address inputs. Since these MISR record clock pulses are applied to the MISR record clock input via line 830, the MISR will record the array data output at a time which corresponds to each transition.

Figure 14F:
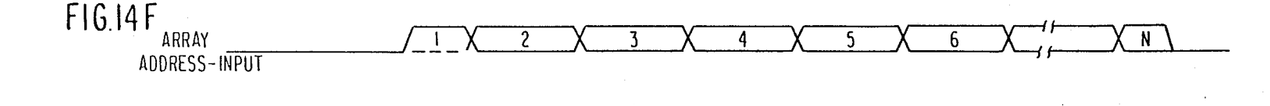
Figure 14G:
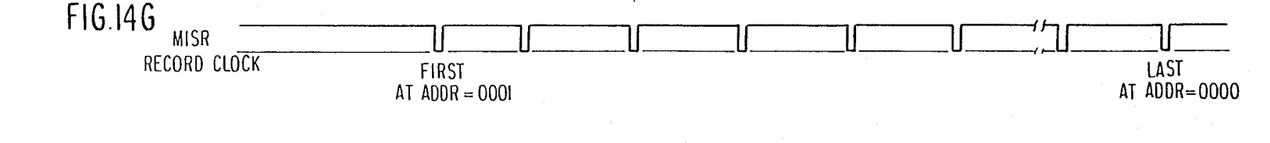

Let us now return to the memory array 620 and the feedback loop. The self-test binary count sequence will continue until there appears at the array address inputs the address 0000 which signifies the end of a self-test cycle. This address 0000 along array address input line 680 is inverted by the inverter group 910 and is applied to the inputs of the AND gate 920 of the start-stop circuit 900. The address 0000, inverted and applied to the AND gate 920, causes AND gate 920 to produce an output which is applied through the OR gate 930 and an inverter/AND group 1020a identical to inverter/AND group 1020 to the reset input of the RS flip-flop 940 as a reset pulse, as shown in FIG. 14C between times T=N and T=N+1. With the RS flip-flop 940 reset, the Q output of the RS flip-flop goes low as is shown in FIG. 14E between times T=N and T=N+1. At this time, the latch B and the MISR record clock circuit 1000 are selected OFF such that the feedback of the array data outputs to the array address inputs and the production of MISR record clock pulses are terminated. These terminations of the array inputs and the MISR record clock pulses are shown in FIGS. 14F and 14G as coinciding with the stop signal shown in FIG. 14 E.

Thus, the memory array device 610 shown in FIG. 11 has the function of allowing a self-test of one cycle through an embedded binary count sequence. This one cycle of self-test is initiated via the EBP test terminal. Once the memory array device 610 has been self-tested for one cycle, the self-test binary count sequence, which has been output at the data array outputs and recorded by the MISR, can be scanned out of the MISR to be checked for correct operation of the memory array 620.

It should be noted that the memory array device 610, shown in FIG. 11, is of a construction which also allows a determination of the access time $T_{acc}$ of the memory array device 610. To accomplish this, the total number of sequence steps which occur in the memory array 620 during the self-test binary count sequence must first be known. Then, the access time $T_{acc}$ can be determined by measuring the total test time from start to stop, as indicated in FIG. 14E, and dividing by the total number of sequencing steps. Thus, the access time $T_{acc}$ of a memory array device 610 may be determined, or checked against a manufacturer's specification.

One variation of the memory array device 610 should be pointed out. Often, it is desirable to construct a memory array which has clocked address inputs; i.e., an address value will not be accepted by the memory array until the transition of a clock pulse. If a memory array of this type is used, either the clock pulse can be supplied externally, or else the memory array device 610 can be provided with an internal clock-generating circuit. In this regard, the MISR record clock circuit 1000 is one example of an internal clock circuit which can be used to provide this clock pulse. Alternatively, any other clock pulse-generating circuit could be used. The only constraint is that a clock pulse must not be generated until the address input has been given sufficient time to stabilize, and should be generated as quickly as possible thereafter to minimize the time required for testing the device.

One final feature, which should be mentioned regarding the memory array devices 610 of FIG. 7A and FIG. 11, is that these devices are compatible with prior art memory array devices in that they allow the loading and unloading of a known test pattern into the memory array 620. This is accomplished by selecting the latch B OFF such that the feedback loop is not operating. The latch A is selected ON via an input to the normal read/write terminal and line 670. In this mode of testing, the same voltage level is applied to both the first voltage line 280 and the second voltage line 290 so that the memory array 620 is operating in a normal read/write fashion. To test the memory array 620, a known test pattern is loaded into the memory array 620 via the device address input lines 650 and the device data input lines 300. Then, this test pattern is unloaded from the memory array 620 via the device address input lines 650 and the device data output lines 700. Thus, the memory array device 610 is of the construction which allows the testing of the memory array device 620 by the loading and unloading of a known test pattern into the memory array, thereby making the memory array devices 610 of the present invention fully compatible with memory test equipment in us today.

As a result of the previously described embodiments of the present invention, a simple method and device are furnished wherein memory array devices having embedded binary patterns can be realized, particularly with a self-test embedded binary pattern.

It is thought that the present invention and many of its intended advantages will be understood from the foregoing description, and it will be apparent that various changes my be made in the form, construction, and arrangements of the parts thereof, without departing from the spirit and scope of the invention in sacrificing all of its material advantages, the form hereinbefore described be merely a preferred or exemplary embodiment thereof.

We claim:

1. A memory array device with an embedded binary pattern, said memory array device comprising:
  a first voltage line and a second voltage line;
  an array of bistable memory cell means, each of said bistable memory cell means being associated with a respective address value and being constructed with first and second sides that each are selectively connectable to said first voltage line or said second voltage line, each of said bistable memory cell means, when said first and second sides are selectively connected to opposite ones of said first and second voltage line, being for:
  (a) functioning, during times when said first and second voltage lines are energized at a same time and voltage level, in a bistable mode; and
  (b) functioning, during times when said first and second voltage lines are energized at at least one of different times and different voltage levels, in an embedded binary pattern mode wherein each of said bistable memory cell means being set to a logical value corresponding to a selected connection of said first and second sides of said bistable memory cell means to said first and second voltage lines.

2. A memory array device with an embedded binary pattern said memory array device comprising:
  a first voltage line and a second voltage line;

an array of bistable memory cell means are different groups of said bistable memory cell means are associated with respective address values and each of said bistable memory cell means being constructed with first and second sides that are each selectively connectable to said first voltage line or said second voltage line, each of said bistable memory cell means, when said first and second sides are selectively connected to opposite ones of said first and second voltage line, being for:
(a) functioning, during times when said first and second voltage lines are energized at a same time and voltage level, in a bistable mode; and
(b) functioning, during times when said first and second voltage lines are energized at at least one of different times and different voltage levels, in an embedded binary pattern mode wherein each of said bistable memory cell means is set to a logical value corresponding to the selected connection of said first and second sides of said bistable memory cell means to said first and second voltage lines.

3. A memory array device as claimed in claim 2, wherein said embedded binary pattern corresponds to an instruction set, and wherein logical values of each of said different group of bistable memory cell means represents an instruction in said instruction set.

4. A memory array device as claimed in claim 2, wherein said embedded binary pattern corresponds to a self-test signature pattern and wherein logical values of each said different group of bistable memory cell means represents a different signature portion of said self-test signature pattern.

5. A memory array device as claimed in claim 2, wherien said embedded binary pattern corresponds to a self-test binary count sequence, and wherein logical values of each said different group of bistable memory cell means represents a binary count value.

6. A memory array device as claimed in claim 5, further comprising feedback loop means for applying said binary count values as address values to cause said memory array to progress through said self-test binary count sequence during a self-test operation.

7. A memory array device as claimed in claim 6, wherein said feedback loop means comprises delay means for introducing a delay in the application of said binary count values as address values so that a race condition does not occur.

8. A memory array device as claimed in claim 7, wherein said feedback loop means comprises latch means, responsive to a clock pulse, for controlling the rate at which said binary count values are applied as address values.

9. A memory array device as claimed in claim 7, further comprising recording means for recording logical values of each of said different groups of bistable memory cell means as said memory array device progresses through a self-test operation.

10. A memory array device as claimed in claim 9, wherein said recording means comprises memory means for recording logical values upon receipt of a clock pulse and wherein said memory array device further comprises clock generation means for producing a clock pulse in synchronization with a sequencing of said memory array through a self-test operation.

11. A memory array device as claimed in claim 7, further comprising cycle means for halting a self-test operation once said memory array has completed an entire self-test cycle.

12. A memory array device with an embedded binary pattern, said memory array device comprising:
a first voltage line and a second voltage line;
an array of bistable memory cell means, each of said bistable memory cell means being associated with a respective address value and each of said bistable memory cell means being constructed with first and second sides, said first side being selectively connected to one of said first voltage line or said second voltage line and said second side being selectively connected to one of said first voltage line or said second voltage line which is not connected to said first side of said bistable memory cell means, each of said bistable memory cell means being for:
(a) functioning, during times when said first and second voltage lines are energized at a same time and voltage level, in a bistable mode; and
(b) functioning, during times when said first and second voltage lines are energized at at least one of different times and different voltage levels, in an embedded binary pattern mode wherein each of said bistable memory cell means is set to a logical value corresponding to a selected connection of said first and second sides of said bistable memory cell means to said first and second voltage lines.

13. A memory array device as claimed in claim 12, wherein said embedded binary pattern is an embedded self-test pattern which corresponds to a binary count sequence and wherein logical values of each different group of bistable memory cell means represents a binary count value.

14. A memory array device as claimed in claim 13, further comprising feedback loop means for applying said binary count values as address values to cause said memory array to progress through said binary count sequence during a self-test operation.

15. A memory array device as claimed in claim 14, wherein said feedback loop means comprises delay means for introducing a delay in the application of said binary count values as address values so that a race condition does not occur.

16. A memory array device as claimed in claim 15, wherein said feedback loop means comprises latch means responsive to a clock pulse, for controlling a rate at which binary count values are applied as address values.

17. A memory array device as claimed in claim 15, further comprising recording means for recording logical values of each different group of bistable memory cell means as said memory array device progresses through a self-test operation.

18. A memory array device as claimed in claim 17, wherein said recording means comprises memory means for recording logical values upon receipt of a clock pulse, and wherein said memory array device further comprises clock generation means for producing a clock pulse in synchronization with a sequencing of said memory array through a self-test operation.

19. A memory array device as claimed in claim 15, further comprising cycle means for halting a self-test operation once said memory array has completed an entire self-test cycle.

20. A memory array device with an embedded binary pattern and a complementary embedded binary pattern, said memory array device comprising:
a first voltage line and a second voltage line;
an array of bistable memory cell means, each of said bistable memory cell means being associated with a respective address value and each of said bistable cells being constructed with first and second sides, said first side being selectively connected to one of said first voltage line or said second voltage line and said second side being selectively connected to one of said first voltage line or said second voltage line which is not connected to said first side of said bistable memory cell means, each of said bistable memory cell means being for:

(a) functioning, during times when said first and second voltage lines are energized at a same time and voltage level, in a read/write mode, wherein said bistable memory cell means can be set to either a logical 1 or 0;

(b) functioning, during times when said first voltage line is energized at at least one of an earlier time or a higher voltage level than an energization of said second voltage line, in an embedded binary pattern mode wherein each of said bistable memory cell means is set to a logical value corresponding to a selected connection of said first and second sides of said bistable memory cell means to said first or second voltage lines; and (c) functioning, during times when said second voltage line is energized at at least one of an earlier time or a higher voltage level than an energization level of said first voltage line, in a complementary embedded binary pattern mode wherein each of said bistable memory cell means is set to a logical value which is a complement of a logical value which would be obtained from function (b) above.

21. A method of providing a memory array device with an embedded binary pattern, said memory array device having an array of bistable memory cell means provided along an array of bit line means and word line means, said method comprising the steps of:

for each respective said bistable memory cell means;

selectively connecting a first side of said bistable memory cell means to bit line means, word line means, and to one of a first voltage line or a second voltage line;

selectively connecting a second side of said bistable memory cell means to bit line means, word line means, and to one of said first voltage line or said second voltage line which is not connected to said first side of said bistable memory cell means;

energizing said first and second voltage lines at at least one of different times and different voltage levels to operate said bistable memory cell means in an embedded binary pattern mode, wherein each of said bistable memory cell means is set to a logical value corresponding to a selected connection of said first and second sides of said bistable memory cell means to said first and second voltage lines.

* * * * *